US009666607B2

(12) United States Patent
Kim et al.

(10) Patent No.: US 9,666,607 B2
(45) Date of Patent: May 30, 2017

(54) DISPLAY DEVICE

(71) Applicant: Samsung Display Co., Ltd., Yongin, Gyeonggi-do (KR)

(72) Inventors: Hong-Kyu Kim, Suwon-si (KR); Bong-Jun Lee, Seoul (KR); Ju Hee Lee, Asan-si (KR); Sun-Kwun Son, Gunpo-si (KR); Jae Yoon Jung, Seoul (KR); Seung Han Jo, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 37 days.

(21) Appl. No.: 13/940,405

(22) Filed: Jul. 12, 2013

(65) Prior Publication Data

US 2014/0209910 A1    Jul. 31, 2014

(30) Foreign Application Priority Data

Jan. 31, 2013  (KR) .................. 10-2013-0011381

(51) Int. Cl.
*G02F 1/1343*  (2006.01)
*G02F 1/1333*  (2006.01)
(Continued)

(52) U.S. Cl.
CPC ...... *H01L 27/124* (2013.01); *G02F 1/134309* (2013.01); *G02F 1/136286* (2013.01);
(Continued)

(58) Field of Classification Search
CPC .. G02F 1/133; G02F 1/1345; G02F 1/134309; G02F 1/126286;
(Continued)

(56) References Cited

U.S. PATENT DOCUMENTS 3,746,949 A * 7/1973 Nienhuis ............ H01L 23/4824
                                                    257/579
5,204,735 A * 4/1993 Yamamoto ............. H01L 23/66
                                                    257/528
(Continued)

FOREIGN PATENT DOCUMENTS

JP  2000-347592  12/2000
JP  2006-178113   7/2006
JP     4801835    8/2011

*Primary Examiner* — Cheung Lee
*Assistant Examiner* — Stephen C Smith
(74) *Attorney, Agent, or Firm* — F. Chau & Associates, LLC

(57) ABSTRACT

A display device includes a signal line disposed on a substrate. A signal input line is disposed on the substrate and connected to a driver. A first insulating layer is disposed on the signal line. A second insulating layer is disposed on the signal input line and the first insulating layer. First contact holes penetrate the first insulating layer and the second insulating layer and expose a portion of the signal line. Second contact holes penetrate the second insulating layer and expose a portion of the signal input line. A connecting member connects the signal line and the signal input line through the first and the second contact holes and is disposed on the second insulating layer. The first and the second contact holes are alternately arranged in the second insulating layer.

15 Claims, 4 Drawing Sheets

(51) Int. Cl.
   *H01L 27/12* (2006.01)
   *H01L 23/485* (2006.01)
   *H01L 23/48* (2006.01)
   *G02F 1/1362* (2006.01)
   *H01L 23/52* (2006.01)
   *H01L 23/482* (2006.01)
   *H01L 23/522* (2006.01)

(52) U.S. Cl.
   CPC ............ *H01L 23/48* (2013.01); *H01L 23/485* (2013.01); *H01L 23/4824* (2013.01); *H01L 23/52* (2013.01); *H01L 23/522* (2013.01)

(58) Field of Classification Search
   CPC ............... G02F 1/136227; H01L 27/12; H01L 27/1214; H01L 27/1248; H01L 23/48; H01L 23/485; H01L 23/4824; H01L 23/49558; H01L 23/52; H01L 23/522; H01L 23/528; H01L 24/46; H01L 24/49; H01L 27/14837; H01L 27/14843
   USPC ........ 349/106, 108, 144, 149, 152; 257/213, 257/413, 690, 700, E23.01, E23.019
   See application file for complete search history.

(56) References Cited

U.S. PATENT DOCUMENTS

| | | | |
|---|---|---|---|
| 5,264,743 A * | 11/1993 | Nakagome | G11O 5/147 326/21 |
| 6,759,732 B1 | 7/2004 | Imamura | |
| 7,557,376 B2 | 7/2009 | Maki et al. | |
| 7,619,710 B2 * | 11/2009 | Nishida | G02F 1/134363 349/110 |
| 7,894,034 B2 | 2/2011 | Park | |
| 7,902,596 B2 * | 3/2011 | Kitamura | H01L 29/66666 257/329 |
| 8,120,746 B2 * | 2/2012 | Shibahara et al. | 349/169 |
| 8,194,223 B2 | 6/2012 | Park | |
| 2002/0139982 A1 * | 10/2002 | Zhang et al. | 257/72 |
| 2008/0018572 A1 | 1/2008 | Shin et al. | |
| 2009/0026462 A1 | 1/2009 | Hashiguchi | |
| 2009/0032955 A1 | 2/2009 | Tanaka et al. | |
| 2010/0214728 A1 | 8/2010 | Aoyagi et al. | |
| 2011/0025968 A1 * | 2/2011 | Yu | G02F 1/136286 349/139 |

* cited by examiner

US 9,666,607 B2

DISPLAY DEVICE

CROSS-REFERENCE TO RELATED APPLICATION

This application claims priority under 35 U.S.C. §119 to Korean Patent Application No. 10-2013-0011381 filed on Jan. 31, 2013 in the Korean Intellectual Property Office, the disclosure of which is incorporated by reference herein in its entirety.

TECHNICAL FIELD

The present invention relates to a display device.

DISCUSSION OF RELATED ART

Pixels of display devices are driven by drivers to display an image. Drivers include a data driver applying a data voltage to a pixel, and a scan driver applying a gate signal controlling transmission of the data voltage. A discrete chip package including drivers may be mounted on a printed circuit board (PCB) and are connected to display panels. Drivers may be integrated with the display panel.

SUMMARY

According to an exemplary embodiment of the present invention, a display device is provided. The display device includes a signal line disposed on a substrate. A signal input line is disposed on the substrate and connected to a driver. A first insulating layer is disposed on the signal line. A second insulating layer is disposed on the signal input line and the first insulating layer. A plurality of first contact holes penetrates the first insulating layer and the second insulating layer and exposes a portion of the signal line. A plurality of second contact holes penetrates the second insulating layer and exposes a portion of the signal input line. A connecting member connects the signal line and the signal input line through the plurality of first contact holes and the plurality of second contact holes and is disposed on the second insulating layer. The plurality of first contact holes and the plurality of second contact holes are alternately arranged in the second insulating layer.

According to an exemplary embodiment of the present invention, a display device is provided. The display device includes a first signal line disposed on a substrate, wherein the first signal line includes a line portion extended in a first direction and having a plurality of first connection regions protruded from the line portion in a second direction. A second signal line is disposed on the substrate and includes a line portion bending around the plurality of first connection regions of the first signal line. A first signal input line is disposed on the substrate and is extended in the second direction, wherein the first signal input line includes one end connected to a driver and the other end having a plurality of second connection regions. A plurality of first contact holes is disposed on the corresponding one of the plurality of first connection regions. A plurality of second contact holes is disposed on the corresponding one of the plurality of second connection regions. A connecting member connects the first signal line and the first signal input line through the plurality of first contact holes and the plurality of second contact holes.

BRIEF DESCRIPTION OF THE DRAWINGS

These and other features of the present invention will become more apparent by describing in detail exemplary embodiments thereof with reference to the accompanying drawings of which.

DETAILED DESCRIPTION OF THE EMBODIMENTS

Figure 1:
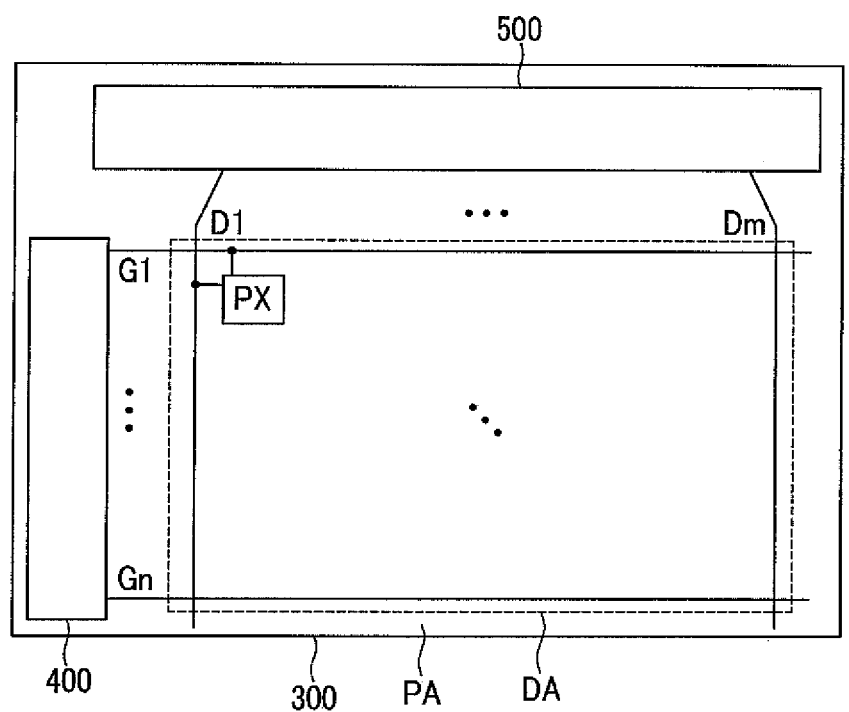
FIG. 1 is a block diagram of a display device according to an exemplary embodiment of the present invention.

Exemplary embodiments of the inventive concept will be described below in more detail with reference to the accompanying drawings. However, the inventive concept may be embodied in different forms and should not be construed as limited to the embodiments set forth herein. In the drawings, the thickness of layers and regions may be exaggerated for clarity. It will also be understood that when a layer is referred to as being "on" another layer or substrate, it may be directly on the other layer or substrate, or intervening layers may also be present. Like reference numerals may refer to the like elements throughout the specification and drawings.

Hereinafter, a display device according to an exemplary embodiment of the present invention will be described with reference to FIG. 1.

FIG. 1 is a block diagram of a display device according to an exemplary embodiment of the present invention.

A display device according to an exemplary embodiment of the present invention includes a display panel 300, a gate driver 400, a data driver 500, etc.

The display panel 300 is divided into a display area DA and a peripheral area PA. The display panel 300 includes a plurality of gate lines G1-Gn, a plurality of data lines D1-Dm, and a plurality of pixels PX connected to the plurality of gate lines G1-Gn and the plurality of data lines D1-Dm. The plurality of pixels PX is arranged in the display area DA, and the peripheral area PA is adjacent to the display area DA. The gate lines G1-Gn transmit a gate signal and the data lines D1-Dm transmit a data voltage. Each pixel PX may include a switching element and a pixel electrode that are connected to one of the gate lines G1-Gn and one of the data lines D1-Dm. The switching element may be a three-terminal element such as a thin film transistor integrated in the display panel 300.

The data driver 500 is connected to the data lines D1-Dm to transmit the data voltage. In an exemplary embodiment, the data driver 500 may be directly mounted in the peripheral area PA of the display panel 300. In an exemplary embodiment, the data driver 500 may be integrated in the peripheral area PA when the switching element including the pixel PX is manufactured. In an exemplary embodiment, the data drive may be disposed on a flexible printed circuit film attached to the display panel 300.

The scan driver 400 is integrated in the peripheral area PA of the display panel 300 and sequentially transmits the gate signal to the plurality of gate lines G1-Gn. The gate signal includes a gate-on voltage Von and a gate-off voltage Voff. In response to a scanning start signal STV, the gate driver 400 starts to output a gate-on pulse, a gate clock signal CPV controlling output timing of a gate-on pulse, and clock signals CK and CKB to sequentially drive the plurality of gate lines G1-Gn. The signal lines to apply these signals to the gate driver 400 may be disposed in the peripheral area PA of the display panel 300.

Various constituent elements besides the display panel 300, the scan driver 400, and the data driver 500 included in the display device according to an exemplary embodiment of the present invention may include a plurality of electrical elements such as a plurality of transistors, a plurality of capacitors, and a plurality of diodes, and each electrical element or wiring connected thereto may include at least one conductive layer. When at least two electrical elements are connected to each other, or one electrical element and an external signal input/output terminal are connected to each other, different conductive layers may be electrically connected to each other. The different conductive layers are electrically connected to each other through a connection according to an exemplary embodiment of the present invention.

A connection structure of the conductive layers positioned at different layers according to an exemplary embodiment of the present invention will be described with reference to FIG. 2 and FIG. 3.

Figure 2:
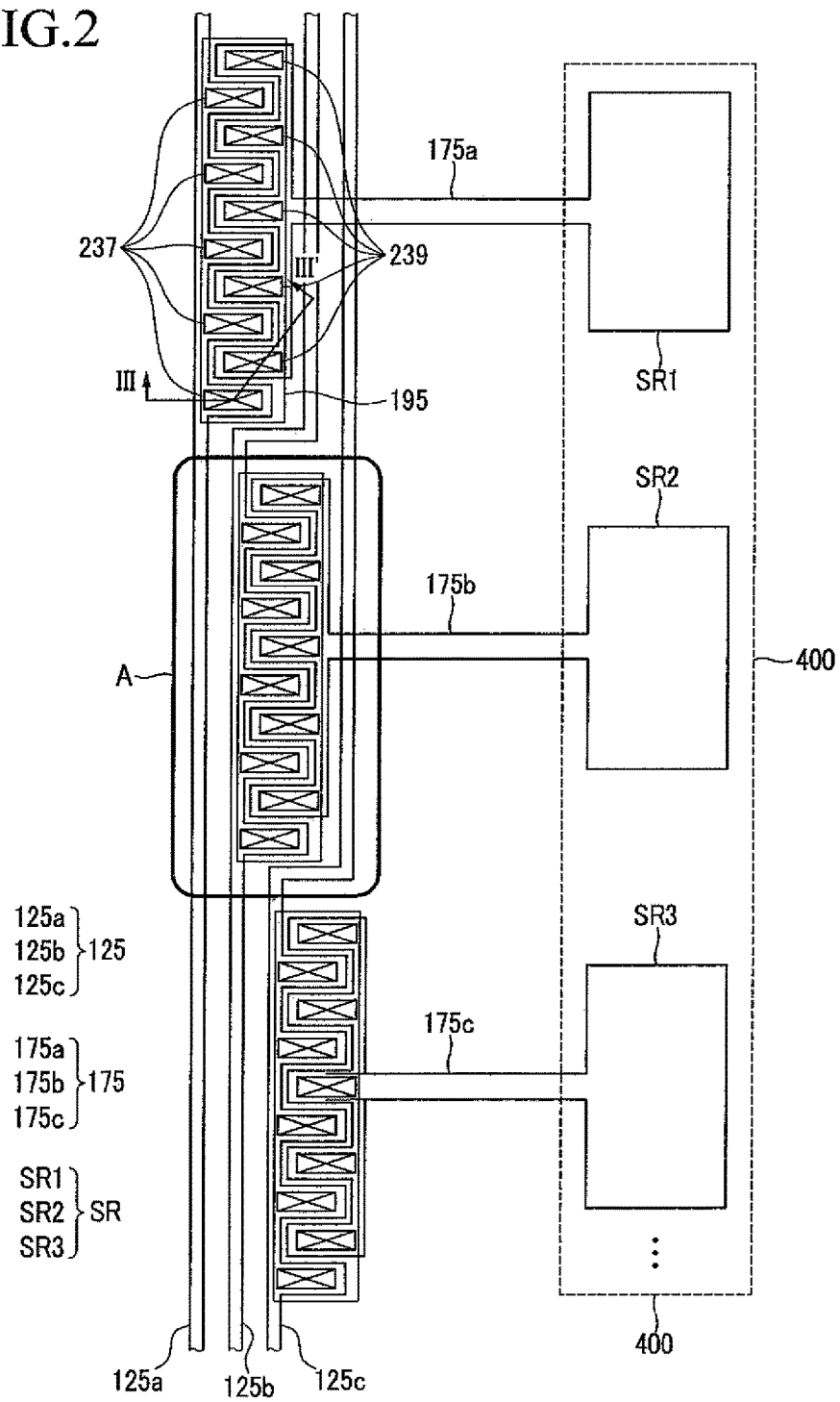
FIG. 2 is a top plan view of a portion of a peripheral area of a display device according to an exemplary embodiment of the present invention.
Figure 3:
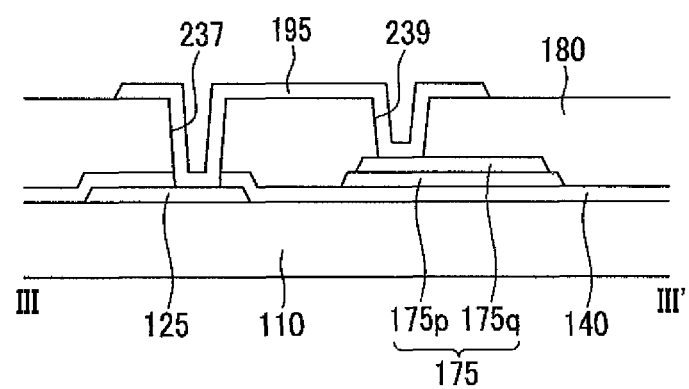
FIG. 3 is a cross-sectional view of a portion of a peripheral area of a display device according to an exemplary embodiment of the present invention taken along line III-III' of FIG. 2.

FIG. 2 is a top plan view of a portion of a peripheral area of a display device according to an exemplary embodiment of the present invention, and FIG. 3 is a cross-sectional view of a portion of a peripheral area of a display device according to an exemplary embodiment of the present invention taken along the III-III' of FIG. 2.

A signal line 125 close to the gate driver 400 is formed on an insulation substrate 110.

The signal line 125 is disclosed in the peripheral area, and may include a gate conductive layer forming the gate line and the gate electrode in the display area. The signal line 125 may include an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), or the like. However, the signal line 125 may have a multilayered structure including at least two conductive layers (not shown). For example, the multilayered structure may include a dual layer including a lower conductive layer and an upper conductive layer. The lower conductive layer may include a metal having lower resistivity to reduce a signal delay or a voltage drop, for example, the aluminum-based metal, the silver-based metal, or the copper-based metal. The upper conductive layer may include a material having small contact resistance such as molybdenum-based metal, chromium, tantalum, or titanium along with a metal oxide of ITO (indium tin oxide) or IZO (indium zinc oxide). For example, there are a chromium lower conductive layer and an aluminum (alloy) upper conductive layer, and an aluminum (alloy) lower conductive layer and a molybdenum (alloy) upper conductive layer. The present invention is not limited thereto, and the signal line 125 may include various metals or conductors.

The signal line 125 may be applied with a clock signal. The signal line 125 may include a plurality of lines. For example, as shown in FIG. 2, the signal line 125 includes three signal lines 125a to 125c. A plurality of signal lines 125 may be applied with clock signals out of phase from each other. Alternatively, the signal line 125 may include six signal lines 125 where three signal lines 125 may be applied with the clock signals and the remaining three signal lines 125 may be applied with corresponding complementary clock signals. The plurality of signal lines 125 may be spaced apart from each other by a predetermined distance.

A first insulating layer 140 may include an inorganic insulating material including silicon oxide (SiOX) and/or silicon nitride (SiNx). The first insulating layer 140 is disposed on the signal lines 125. The first insulating layer 140 is disposed on the substrate 110 including the signal lines 125.

The gate driver 400 includes a plurality of stages SR, and a signal input line 175 extending from each stage SR is disposed on the first insulating layer 140.

The signal input line 175 may be disposed between a plurality of signal lines 125. In FIG. 2, the gate driver includes three stages SR. Each stage SR of the gate driver 400 is connected to the corresponding signal input lines 175a to 175c. The present invention is not limited to the gate driver 400 having three stages. For example, the gate driver 400 may include four or more stages SR, and four or more signal input lines 175 connected to the stages SR may be formed.

The signal input line 175 and the signal line 125 are disposed close to each other. At least one end portion of the signal input line 175 may be disposed between the plurality of signal lines 125. The signal input line 175 disposed between a plurality of signal lines 125 may overlap at least one signal line 125. The signal line 125 includes In FIGS. 2 and 3, a first signal input line 175a connected to the first stage SR1 overlaps a second signal line 125b and a third signal line 125c. The first signal input line 175a is connected to a first signal line 125a by a connecting member 195. The first signal line 125a includes a line portion and a plurality of first connection regions. The line portion is extended in a first direction, and the plurality of first connection regions are protruded from the line portion of the signal line 125a in a second direction crossing the first direction. The signal input line 175a includes a plurality of second connection regions disposed at an end of the signal input line 175a and extended in the second direction. A plurality of first contact holes 237 is disposed on the corresponding first connection regions of the signal line 125a and exposes a portion of the signal line 125a. A plurality of second contact holes 239 is disposed on the corresponding second connection regions of the signal input line 175a and exposes a portion of the signal input line 175a. The connecting member 195 connects the signal line 125a and the signal input line 175a through the plurality of first contact holes 237 and the plurality of second contact holes 239. The plurality of first connection regions of the signal line 125a and the plurality of second connection regions are alternately disposed along the first direction that the line portion of the signal line 125a is extended.

In a similar way, a second signal input line 175b is connected between the second stage SR2 and the second signal line 125b and overlaps the third signal line 125c. A third signal input line 175c is connected between the third stage SR3 and the third signal line 125c.

The second signal line 125b is extended along the first direction and is bent around the connection regions of the first signal line 125a. In a similar way, the third signal line 125c is extended along the first direction and is bent around connection regions of the second signal line 125b. This signal line structure minimizes area increase resulted from the connection regions of the signal line 125.

The stage SR1 disposed at the uppermost side among the plurality of stages SR is regarded as the first stage SR1, and the signal line 125a disposed at the leftmost side among the plurality of signal lines 125 is regarded as the first signal line 125a.

In FIG. 2, the plurality of second connections disposed at the end of the signal input line 175 has a sawtooth shape, however the end of the signal input line 175 may have various shapes.

The signal input line 175 may include a semiconductor layer 175p and a metal layer 175q disposed on the semiconductor layer 175p. The gate driver 400 and the signal input line 175 are disposed in the peripheral area. The semiconductor layer 175p of the signal input line 175 may include a semiconductor material forming a semiconductor layer in the display area, and the metal layer 175q of the signal input line 175 may include a conductive layer forming the data line, the source electrode, and the drain electrode in the display area.

The metal layer 175q may include a metal such as molybdenum, chromium, tantalum, and titanium, or alloys thereof. The metal layer 175q may have a multilayered structure including at least two conductive layers (not shown). For example, the metal layer 175q includes a dual layer including a chromium or molybdenum (alloy) lower conductive layer and an aluminum (alloy) upper conductive layer. Alternatively, the metal layer 175q includes a triple layer including a molybdenum (alloy) lower conductive layer, an aluminum (alloy) middle conductive layer, and a molybdenum (alloy) upper conductive layer. However, the present invention is not limited thereto, and the metal layer 175q may include various metals or conductors.

Although not shown, an ohmic contact may be disposed between the semiconductor layer 175p and the metal layer 175q. For example, the ohmic contact includes n+ hydrogenated amorphous silicon doped with an n-type impurity at a high concentration or silicide.

The semiconductor layer 175p and the metal layer 175q may be simultaneously patterned by using the same mask. The width of the underlying semiconductor layer 175p is greater than the width of the metal layer 175q. Accordingly, the upper surface of the semiconductor layer 175p is partially exposed at both edges of the metal layer 175q.

A second insulating layer 180 may include an inorganic insulating material such as silicon oxide (SiOX) and/or silicon nitride (SiNx). The second insulating layer 180 is disposed on the signal input line 175. The second insulating layer 180 is disposed on the substrate 110 including the signal input line 175.

The first insulating layer 140 and the second insulating layer 180 have a first contact hole 237 exposing at least a portion of the signal line 125. Also, the second insulating layer 180 has a second contact hole 239 exposing at least a portion of the signal input line 175.

The first contact hole 237 and the second contact hole 239 may include a plurality of contact holes. For example, as shown in FIG. 2, five first contact holes 237 are disposed on the corresponding first connection regions of the first signal line 125a. Five second contact holes 239 are disposed on the corresponding second connection regions of the first input signal line 175a.

In an exemplary embodiment, the first contact holes 237 and the second contact holes 239 are alternately arranged in a zigzag shape along the first direction. Alternatively, the first contact holes 237 and the second contact holes 239 may be arranged in a straight line along the first direction.

In an exemplary embodiment, a portion of the signal line 125 exposed by the first contact hole 237 need not overlap a portion of the signal input line 175 exposed by the second contact hole 239.

The connecting member 195 to connect the signal line 125 and the signal input line 175 through the first contact hole 237 and the second contact hole 239 is disposed on the second insulating layer 180. The connecting member 195 may be disposed in the peripheral area and may include a conductive material forming the pixel electrode in the display area. For example, the connecting member 195 may include a transparent conductive material such as ITO (indium tin oxide) or IZO (indium zinc oxide), or a reflective metal such as aluminum, sliver, chromium, or alloys thereof.

The connecting member 195 is connected to the signal line 125 and the signal input line 175, and the clock signal applied to the signal line 125 is transmitted to the gate driver 400 through the signal input line 175.

Figure 4:
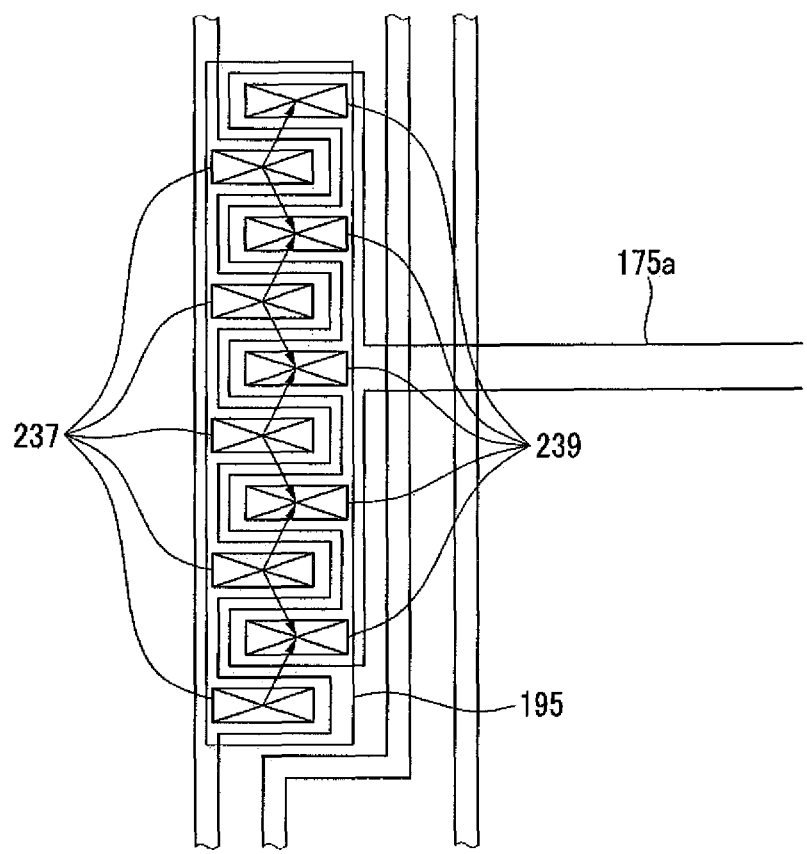
FIG. 4 is an enlarged view of an area "A" shown in FIG. 2.

FIG. 4 is an enlarged view of an area "A" shown in FIG. 2.

Referring to FIG. 4, an arrow indicates a direction that a current flows. The connection structure increases contact areas between the signal line 125 and the signal input line 175 and thus contact resistance is reduced.

In a display device according to an exemplary embodiment of the present invention, the connection structure of the gate driver 400 and the signal line 125 is integrated on the substrate 110, however the present invention is not limited thereto. The data driver may be integrated on the substrate and a connection structure of the data driver and other signal lines may have the same or similar connection structure.

Further, the connection structure according to an exemplary embodiment of the present invention may connect a layer disposed in the display area and other wirings. While the present inventive concept has been shown and described with reference to exemplary embodiments thereof, it will be apparent to those of ordinary skill in the art that various changes in form and detail may be made therein without departing from the sprit and scope of the inventive concept as defined by the following claims.

What is claimed is:

1. A display device comprising:
   a substrate;
   a signal line disposed on the substrate;
   a signal input line disposed on the substrate and connected to a driver, wherein the signal input line includes a line section and a saw tooth shape end and wherein the saw tooth shape end is wider than the line section;
   a first insulating layer disposed on the signal line;
   a second insulating layer disposed on the signal input line and the first insulating layer;
   a plurality of first contact holes penetrating the first insulating layer and the second insulating layer and exposing a portion of the signal line;
   a plurality of second contact holes penetrating the second insulating layer and exposing a portion of the saw tooth shape end of the signal input line; and
   a connecting member connecting the signal line and the saw tooth shape end of the signal input line through the plurality of first contact holes and the plurality of second contact holes and disposed on the second insulating layer,
   wherein each of the plurality of first contact holes and each of the plurality of second contact holes are alternately arranged in the second insulating layer and in parallel to a first direction along which the signal line extends, wherein each of the plurality of second contact holes is shifted along a second direction from each of the plurality of first contact holes to the extent that two adjacent each of the plurality of first contact holes and each of the plurality of second contact holes are partially overlapped with each other along the first direction, and wherein the second direction is substantially perpendicular to the first direction.

2. The display device of claim 1,
wherein a portion of the signal line exposed by each of the plurality of first contact holes and a portion of the signal input line exposed by each of the plurality of second contact holes are not overlapped with each other.

3. The display device of claim 1,
wherein the signal input line includes a semiconductor layer and a metal layer disposed on the semiconductor layer.

4. The display device of claim 3,
wherein the signal input line is disposed on the first insulating layer.

5. The display device of claim 4,
wherein the first insulating layer and the second insulating layer include an inorganic insulating material including silicon oxide (SiOx) or silicon nitride (SiNx).

6. The display device of claim 1,
wherein the signal line transmits a clock signal.

7. The display device of claim 6,
wherein the driver is integrated on the substrate.

8. The display device of claim 7,
wherein the driver includes a gate driver transmitting a gate signal.

9. The display device of claim 1,
wherein the connecting member includes indium tin oxide (ITO) or indium zinc oxide (IZO).

10. The display device of claim 1,
wherein the substrate includes a display area and a peripheral area adjacent to the display area, and the signal line, the driver, and the signal input line are disposed in the peripheral area.

11. A display device comprising:
a substrate;
a first signal line disposed on the substrate, wherein the first signal line includes a line portion extending in a first direction and having a plurality of first connection regions protruded from the line portion in a second direction;
a first signal input line disposed on the substrate and extending in the second direction, wherein the first signal input line includes one end connected to a driver and the other end having a plurality of second connection regions, wherein the second connection regions are spaced apart from each other;
a plurality of first contact holes disposed on the corresponding one of the plurality of first connection regions;
a plurality of second contact holes disposed on the corresponding one of the plurality of second connection regions;
a connecting member connecting the first signal line and the first signal input line through the plurality of first contact holes and the plurality of second contact holes;
a second signal line disposed on the substrate and including a line portion bending around the plurality of first connection regions of the first signal line;
a first insulating layer disposed on the first and the second signal lines; and
a second insulating layer disposed on the first signal input line and the first insulating layer, wherein each of the plurality of second contact holes is shifted along the second direction from each of the plurality of first contact holes to the extent that two adjacent each of the plurality of first contact holes and each of the plurality of second contact holes are partially overlapped with each other along the first direction, wherein the plurality of first contact holes penetrates the first insulating layer and the second insulating layer, and wherein the plurality of second contact holes penetrates the second insulating layer.

12. The display device of claim 11,
wherein the first signal input line is disposed on the first insulating layer.

13. The display device of claim 11,
wherein the plurality of first contact holes exposes portions of the corresponding first connection regions of the first signal line, and
wherein the plurality of second contact holes exposes portions of the corresponding second connection regions of the first signal input line.

14. The display device of claim 11,
wherein each of the plurality of first contact holes and each of the plurality of second contact holes are alternately arranged along the first direction.

15. The display device of claim 11,
wherein the plurality of first connection regions of the first signal line has a saw tooth shape.

* * * * *